(12) United States Patent
Tucker et al.

(10) Patent No.: US 7,916,000 B2
(45) Date of Patent: Mar. 29, 2011

(54) AUTOMATIC ANTENNA TUNER SYSTEM FOR RFID

(75) Inventors: Randall L. Tucker, Findlay, OH (US);
Gary T. Carroll, Louisville, CO (US);
John T. Carroll, Longmont, CO (US)

(73) Assignee: Cooper Tire & Rubber Company, Findlay, OH (US)

( * ) Notice: Subject to any disclaimer, the term of this patent is extended or adjusted under 35 U.S.C. 154(b) by 268 days.

(21) Appl. No.: 12/284,508

(22) Filed: Sep. 23, 2008

(65) Prior Publication Data

US 2009/0109003 A1    Apr. 30, 2009

Related U.S. Application Data

(60) Provisional application No. 60/994,834, filed on Sep. 24, 2007.

(51) Int. Cl.
*H04Q 5/22* (2006.01)
(52) U.S. Cl. ............... 340/10.1; 340/572.7; 375/238
(58) Field of Classification Search .............. 340/10.1, 340/572.1–572.8; 375/238
See application file for complete search history.

(56) References Cited

U.S. PATENT DOCUMENTS

| | | |
|---|---|---|
| 5,491,715 A | 2/1996 | Flaxl |
| 5,835,977 A | 11/1998 | Kamentser et al. |
| 5,872,320 A | 2/1999 | Kamentser et al. |
| 6,480,110 B2 | 11/2002 | Lee et al. |
| 6,703,935 B1 | 3/2004 | Chung et al. |
| 6,861,993 B2 | 3/2005 | Waldner |
| 6,943,688 B2 | 9/2005 | Chung et al. |
| 6,950,009 B1 | 9/2005 | Nysen |
| 7,023,391 B2 | 4/2006 | Wuldart et al. |
| 7,036,729 B2 | 5/2006 | Chung |
| 7,075,437 B2 | 7/2006 | Bridgelall et al. |
| 7,132,944 B1 | 11/2006 | Kron et al. |
| 7,167,090 B1 | 1/2007 | Mandal et al. |
| 7,199,716 B2 * | 4/2007 | Shanks et al. ............. 340/572.1 |
| 7,202,790 B2 | 4/2007 | Copeland et al. |
| 7,268,687 B2 | 9/2007 | Egbert et al. |
| 7,298,343 B2 | 11/2007 | Forster et al. |
| 7,317,426 B2 | 1/2008 | Copeland et al. |
| 7,321,290 B2 | 1/2008 | Stevens et al. |
| 7,714,697 B2 * | 5/2010 | Soleimani et al. ........... 340/10.2 |
| 2006/0192628 A1 | 8/2006 | Schulman et al. |
| 2006/0238307 A1 | 10/2006 | Bauer |
| 2007/0035383 A1 | 2/2007 | Roemerman et al. |
| 2007/0091006 A1 | 4/2007 | Thober et al. |
| 2007/0132555 A1 | 6/2007 | August et al. |
| 2007/0194945 A1 | 8/2007 | Atkinson |
| 2007/0222609 A1 | 9/2007 | Duron et al. |

OTHER PUBLICATIONS

International Search Report; Nov. 26, 2008.
International Search Report; Jun. 7, 2010.

* cited by examiner

*Primary Examiner* — Eric M Blount
(74) *Attorney, Agent, or Firm* — Emch, Schaffer, Schaub & Porcello Co. L.P.A.

(57) ABSTRACT

An automatic antenna tuner system for radio frequency identification system includes a pulse width modulator, a microprocessor for controlling the generation of a source signal from the modulator, capacitors for receiving the source signal from amplifiers and transmitting it to an inductor, a gate communicating with the capacitors for transmitting a resonating signal from the inductor and capacitors as a carrier signal and means for gating the carrier signal with the source signal to produce a compared signal to produce a string of pulses and means for varying capacitance to increase or decrease the count of the string of pulses.

15 Claims, 2 Drawing Sheets

AUTOMATIC ANTENNA TUNER SYSTEM FOR RFID

CROSS REFERENCE TO RELATED APPLICATION

This application is based upon and claims the benefit of U.S. Provisional Application No. 60/994,834 filed Sep. 24, 2007.

BACKGROUND OF THE INVENTION

In the manufacture and use of RFID (Radio Frequency Identification), the technology is divided into two major groups; The first group is Passive Tags that gather their power from close coupling to a reader, thus enabling them to transmit or reflect information back to the reader. The second groups is Active Tags, which have their own power storage capability like a battery, capacitor or other devices. The active tag is queried with an RF signal generated by the reader requesting the tag to transmit the data, which data is received by the reader. Passive tags typically have a range of a few inches up to a meter. Active tags can transmit tens of meters but have a limited life due to the battery limits. The active tag has a limited life due to the battery or capacitor's limited shelf life.

The prior art includes a number of patents directed to antenna tuning for an RFID system. Among these is U.S. Pat. No. 5,491,715 which provides a method and system for matching the resonant frequency of an antenna resonant circuit to the output frequency of a transmitter output. A powering signal is transmitted to the antenna resonant circuit, which circuit includes a tuning circuit which is operable to variably modify the resonant frequency of the resonant circuit. At its output the antenna resonant circuit provides a phase correlation signal having a known relationship to the frequency difference between the resonant frequency and the powering signal. A phase comparative then receives the powering signal and the phase correlation signal and correspondingly adjusts the resonant frequency of the resonant circuit based upon the known phase relationship.

SUMMARY OF THE INVENTION

The Automatic Antenna Tuning device of the present invention provides (1) a wake-up signal for the active RFID transponder tags and (2) power to operate passive RFID transponder passive tags or multitude of sensors, receivers, transmitters or other electrical or electronic devices.

The antenna tuner of the present invention can power up a passive tag out to four feet in a field of 30 by 60 feet and can be used to wake up an active transponder tag that uses no battery current until awakened, thereby increasing its life over the expected life had it been in the continually awakened state.

Under the present invention, a power generating system is used to control a remotely operated loop antenna. The loop antenna generates an electromagnetic field that can be used to power up RFID transponder tag devices, sensors, receivers, transmitters or other electrical or electronic devices. This concept is to have large numbers of these remote electronic devices located on shelves, racks, pallets, etc., collecting data, reporting back to a central computer for management to track the operations of the facility. These electronic devices are typically without batteries and therefore require minimal or no maintenance. Some devices will have a battery but are totally asleep, drawing little or no current, and are awakened by the electromagnetic signal from the loop antenna in the ceiling, walls or floor.

In order to be efficient, the loop antenna should be of the highest quality or "Q factor". Q. is a ratio of inductance reactance divided by its resistance. With this relationship, the lower the resistance of the coil (wire) the higher the Q or quality of the loop. This means that the tuning is critical and must be maintained at all times. A remote power generating loop antenna in a facility can easily be affected by the environment that it is in. If large metal shelves or products are moved away from or moved near the antenna, the tuning can be effected. The efficiency of the antenna can be severely affected to a point where it is no longer tuned to the peak and therefore not able to perform its required function.

The need to re-tune the loop antenna is important in order to maximize the generation of power at all times. As equipment is relocated in the facility and the power generation antenna becomes detuned, the efficiency is reduced. A worker will have to manually go out to the factory from time to time to optimize the loop antenna's tuning.

Under a preferred embodiment of the present invention, when the power is generated by the antenna, it will be electromagnetically coupled to the remote electronic devices that are positioned throughout the facility. If the loop antenna can be automatically re-tuned every time a piece of equipment is relocated in the local area, then the efficiency of the passive electronic device is maintained at a peak and the need to manually adjust the loop antenna is negated.

The automatic antenna tuner of the present invention is designed to test the resonance of the loop antenna at predetermined intervals to maintain the integrity of the loop antenna. Then when the computer system that is doing an inquiry of the area needs to power up the electronic devices positioned throughout the facility, the loop antenna will work efficiently as designed to power up such RFID transponder tags or other electronic devices.

The electromagnetic field generated by the antenna could also be encoded to provide instructions to the receiving device to turn-on, turn-off, or to perform some other specific task or operation such as store new data in memory, erase memory or go to sleep.

One preferred embodiment of the present invention is to increase the capability over current battery technology by maintaining an ongoing charge to power remotely positioned electronic devices, thereby providing a potentially infinite shelf life for such devices. This will have significant advantages in reliability of the utilizing equipment. The present invention could also provide an external power source for medical, biomedical, night vision, GPS, radios, sensors, actuators and intelligence gather technologies.

Electromagnetic field antennas are typically used to power up an RFID transponder tag so as to read back the identification of the user or device. One preferred embodiment of the present invention is to place an antenna in the ceiling, walls or floor of a warehouse, factory or shipping/receiving dock. RFID transponder tag devices, sensors, receivers, transmitters or other electrical or electronic devices are placed within the field of these antennas and are powered up or awakened by their antennas from time to time. When these RFID transponder tags or other electronic devices are awakened, they will transmit back their data to the computer system that is controlling these antennas.

The automatic tuning system of the present invention includes a microprocessor that is in communication with a main computer. The main computer will, from time to time, signal the automatic tuning system to wake up the RFID devices, sensors, receivers, transmitters or electrical or electronic devices in its area and send back the received data to the computer.

The microprocessor will power up the antenna by driving current into the antenna at a prescribed frequency. As an example, the antenna could be driven at a frequency of 125 kHz. The software with the microprocessor will then look at the phase of the driving or source signal and compare it with the resulting phase of the carrier signal on the antenna. If they are close to 90 degrees out of phase from each other, then the antenna is tuned properly. If the signals are not 90 degrees out of phase, the microprocessor will either add or remove capacitance to properly tune the antenna.

Other objects and advantages of the present invention will become apparent to those skilled in the art upon a review of the following detailed description of the preferred embodiments and the accompanying drawings.

DETAILED DESCRIPTION OF THE PREFERRED EMBODIMENT(S)

Figure 1:
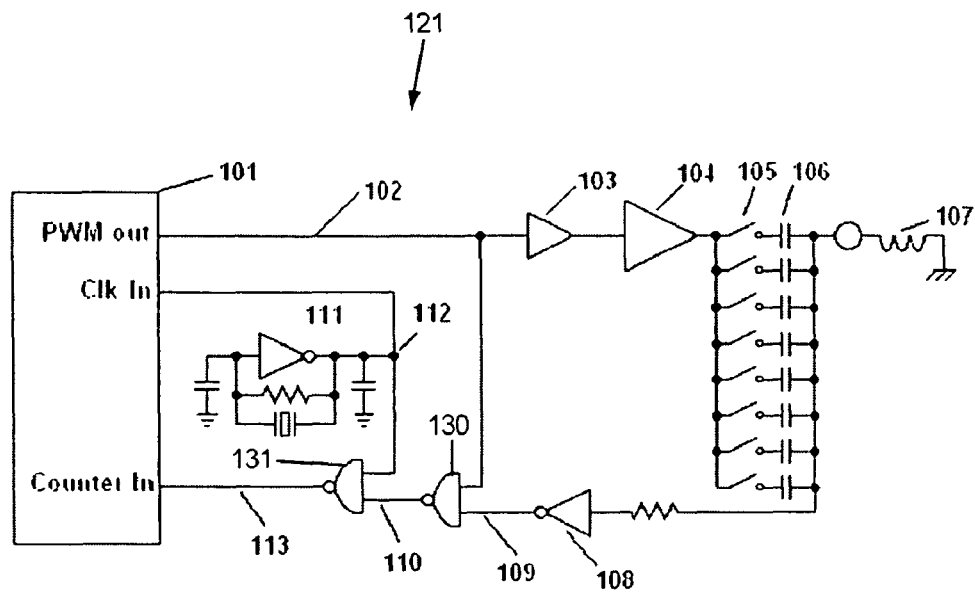
FIG. 1 is a schematic view showing the basic concept of microprocessor controlled automatic antenna tuner.

FIG. 1 illustrates the schematic of the basic circuit for the automatic antenna tuner system 121 of the present invention. A microprocessor 101 similar to Microchip Inc.'s PIC16F628 controls the generation of the frequency of a source signal 102 out of a pulse width modulation (PWM) output pin. This source signal 102 is 125 kHz for this design but can be almost any frequency desired to power up the wireless peripherals in its electromagnetic field. The source signal 102 is amplified by a MOSFET driver 103 and then driven into a pair of heavy MOSFET transistors 104. For example, the MOSFET driver 103 could be one manufactured by Microchip as its Model No. TC4422 which amplifies the power up to a level that the high capacitance inputs of the MOSFETs 104 require. These MOSFETs are designed to drive heavy currents and high voltage to drive a bank of capacitors 106. The MOSFET 104 could be one manufactured by International Rectifier as its Model No. JRF9530 and IRF530. These capacitors 106 are selected individually by relay contacts 105 to tune the capacitors 106 and inductor 107 to resonance at 125 kHz.

The inductor 107 can be any one of a wide range of devices. For example, it could be a small two inch loop of 24 gauge wire or a heavy piece of wire or pipe that stretches across the ceiling, wall or floor of the facility or many other materials capable of conducting electrical current. The dimensions of this inductor 107 can reach as far as 30 by 60 feet and wire size could be as heavy as 2 gauge. A typical application in a factory would be 30 by 60 feet to allow for free flow of equipment while covering a reasonable field. Successful tests have shown that the inductor 107 can be a length of wire stretching from the automatic tuner to a distant point where the end is grounded to a metal frame of the building and the ground of the building is the return path for the loop. Without limiting the scope of the present invention or the maximum length of such wire, the length of wire used in such tests was 60 feet.

The source signal 102, powered up by the MOSFET drivers 103, 104 is transmitted through one or more capacitors 106 to the inductor 107 which selectively forwards a resonating signal through one or more capacitors 106 to a gate 108. The output of gate 108 is a carrier signal 109. Desirably, this carrier signal 109 is either leading or lagging in phase compared to the source signal 102 by 90 degrees. The carrier signal 109 is gated through AND gate 130 with the source signal 102 to produce a compared signal 110. This compared signal 110 is gated through AND gate 131 with a 20 MHz crystal 112 to produce a string of pulses 113 that the microprocessor 101 will use to decide if the antenna is properly tuned.

Figure 2:
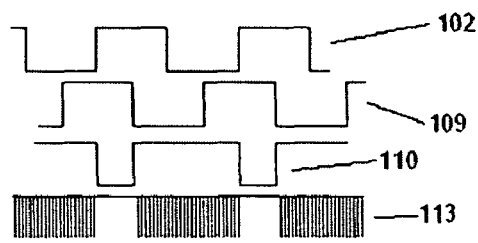
FIG. 2 is a timing diagram illustrating proper tuning.

FIG. 2 illustrates the timing relationship between the source signal 102 with the carrier signal 109 from the gate 108. If the antenna is tuned to resonance, the relationship between these two signals is 90 degrees as shown. As noted above, compared signal 110 is the result of the two signals, namely, source signal 102 and carrier signal 109 ANDed together through the AND gate 130. Pulses 113 are gated through to a counter in the microprocessor 101.

At 125 kHz, the "on" time of source signal 102 is 4 uS and the "off" time is also 4 uS. When the antenna is tuned properly, compared signal 110 is "on" for 6 uS and "off" for 2 uS. This allows 120 pulses from the 20 MHz crystal 112 to be gated through the AND gate 131 to the microprocessor 101 and its counter. A properly tuned antenna will produce a count of approximately 120 counts. Gate delays, rise and fall times will effect the actual count.

Figure 3:
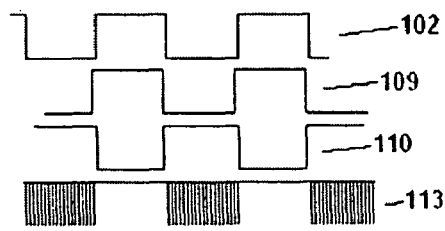
FIG. 3 is a timing diagram illustrating tuning with too much capacitance.

FIG. 3, illustrates the timing relationship between the source signal 102 and the carrier signal 109 when there is too much capacitance and the phase difference between the source signal 102 and the carrier signal 109 is extended. The number of pulses 113 are now less than 120 and the software in the microprocessor can cause more capacitance to be added by controlling the capacitors 106 and their relay contacts 105 until the count is approximately 120.

Figure 4:
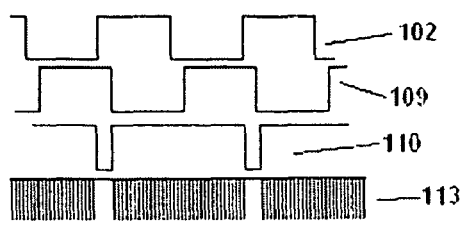
FIG. 4 is a timing diagram illustrating tuning with too little capacitance.

FIG. 4 illustrates the timing relationship between the source signal 102 and the carrier signal 109 when there is too little capacitance. Again, the software will see that there is more than 120 pulses 113 and add some capacitance until the count is approximately 120.

Figure 5:
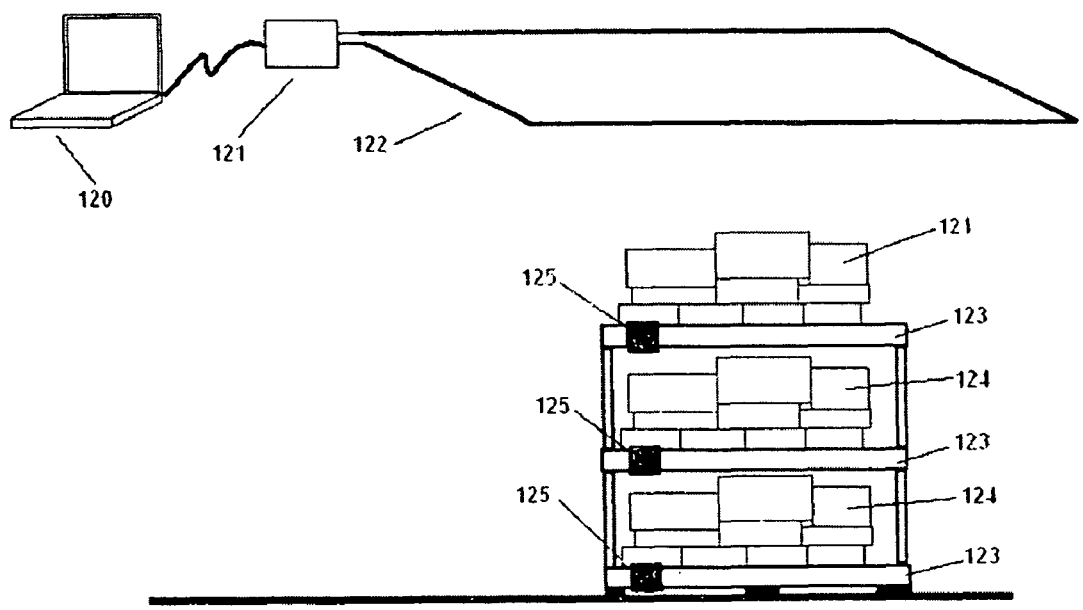
FIG. 5 illustrates the powering of wireless RFID transponders in a factory.

FIG. 5 illustrates an antenna 122 located in the ceiling of a factory. The antenna tuner 121 is connected to a computer 120 that controls the operation of the antenna.

Below the antenna is a stack of pallets 123 with the product 124 on the pallets. Three of these pallets 123 are stacked as a unit. On each pallet is an RFID transponder tag 125 that will receive either a wake-up signal if it is an active tag or power if it is a passive tag. The computer 120 will, from time to time, send a command to the tuner 121. This command will tell the tuner to do an inventory of all transponder tags 125 that are within its magnetic field. Those transponder tags that are within its magnetic field will wake up and send back their ID thereby giving the computer a snapshot of what is on the factory floor at that time and at that location. This operation may only happen once per day or even once per week if the inventory is not moved that often. But if the inventory is moved at an accelerated rate, the computer could do an inventory check every hour or even every minute if needed. The transponder tag will then send back to the antenna 122 its ID and possibly other data if it is programmed with such data. The antenna tuner system is a peripheral of the computer system. This means that the computer can access the tuner(s) at any time and update or verify the inventory or even track it's location as it moves throughout the factory.

The above detailed description of the present invention is given for explanatory purposes. It will be apparent to those skilled in the art that numerous changes and modifications can be made without departing from the scope of the invention. Accordingly, the whole of the foregoing description is to be construed in an illustrative and not a limitative sense, the scope of the invention being defined solely by the appended claims.

We claim:

1. An automatic antenna tuning system comprising:
   (a) a pulse width modulator;
   (b) a microprocessor for controlling the generation of frequency of a source signal from said modulator;
   (c) an inductor;
   (d) a plurality of relay contacts and capacitors for receiving said source signal from said amplifiers and transmitting it to said inductor, said inductor and capacitor generating a resonating signal;
   (e) a gate communicating with said capacitors through one or more relay contacts for transmitting said resonating signal as a carrier signal;
   (f) means for gating said carrier signal with said source signal to produce a compared signal for gating with a crystal to produce a string of pulses, said microprocessor having a (i) counter for determining the count of said string of pulses and (ii) means for varying capacitance to increase or decrease the count of said string of pulses until the count is substantially 120.

2. The automatic antenna tuning system of claim 1 wherein said tuning system is connected to an antenna located in a facility and to a computer or microprocessor and further including a plurality of spaced apart RFID transponders positioned in said facility, said RFID transponders adapted to receive a signal from said computer or microprocessor and transmit such signal back to said tuned antenna.

3. An automatic antenna tuning system comprising:
   (a) a pulse width modulator;
   (b) a microprocessor for controlling the generation of frequency of a source signal from said modulator;
   (c) one or more amplifiers for amplifying said source signal;
   (d) an inductor;
   (e) a plurality of relay contacts and capacitors for receiving said source signal from said amplifiers and transmitting it to said inductor, said inductor, and capacitor generating a resonating signal;
   (f) a gate communicating with said capacitors through one or more relay contacts for transmitting said resonating signal as a carrier signal;
   (g) means for gating said carrier signal with said source signal to produce a compare signal for gating with a crystal to produce a string of pulses, said microprocessor having a (i) counter for determining the count of said string of pulses and (ii) means for varying capacitance to increase or decrease the count of said string of pulses until the count is substantially 120.

4. A method for tuning an antenna for a radio frequency identification system (RFID) comprising the steps of:
   (a) emitting a source signal from a pulse width modulator at a frequency;
   (b) amplifying and transmitting said source signal to a plurality of capacitors and to an inductor, each capacitor having a relay contact;
   (c) transmitting a signal from said inductor through one or more capacitors to form a carrier signal;
   (d) gating said carrier signal with said source signal to produce a compared signal;
   (e) comparing whether said carrier signal is leading or lagging in phase by 90 degrees compared to said source signal;
   (f) adding or reducing capacitance to vary the count per cycle of said compared signal as needed to establish a 90 degree phase between said carrier signal and said source signal.

5. The method according to claim 4 further including the step of increasing capacitance to reduce the number of pulses per cycle or reducing capacitance to increase the number of pulses per cycle until the count is substantially 120.

6. The method according to claim 4 further including the steps of:
   (a) positioning said antenna in a facility in communication with said tuning system;
   (b) positioning a plurality of RFID transponders in said facility;
   (c) transmitting a signal from a computer or microprocessor to one or more of said RFID transponders; and
   (d) transmitting a signal from said one or more RFID transponders to said antenna and said computer;
   (e) gating said compared signal through an AND gate with a crystal to produce a string of pulses defining the count per cycle; and
   (f) increasing capacitance to reduce the number of pulses per cycle or reducing capacitance to increase the number of pulses per cycle until the count is substantially 120.

7. A method for tuning an antenna for a radio frequency identification system comprising the steps of:
   (a) delivering power by means of a source signal to an inductor at a frequency, at a phase;
   (b) transmitting a resonating signal from said inductor through one or more capacitors to a gate;
   (c) transmitting a carrier signal from said gate and gating said carrier signal through an AND gate to join with said source signal to produce a compared signal which is gated with a crystal to produce a string of pulses;
   (d) comparing the phase of the source signal with the phase of the carrier signal;
   (e) adding or reducing capacitance to the signal from said inductor if, but only if, the phase difference between the phase of the source signal and the phase of the carrier signal is greater or less than 90 degrees; and
   (f) increasing capacitance to reduce the number of pulses per cycle or reducing capacitance to increase the number of pulses per cycle until the count is substantially 120.

8. The method according to claim 7 further including the step of encoding the signal from said antenna and transmitting said encoded signal to a remote receiving device.

9. A method for controlling inventory of product in a facility comprising the steps of:
   (a) positioning an antenna and a plurality of RFID transponders in said facility;
   (b) engaging an antenna tuning system to said antenna, said tuning system including a pulse width modulator and an inductor;
   (c) transmitting a source signal from said pulse width modulator to a plurality of capacitors and to said inductor, each capacitor having a relay contact;
   (d) transmitting a signal from said inductor through one or more capacitors to form a carrier signal;
   (e) gating said carrier signal with said source signal to produce a compared signal;

(f) comparing whether said carrier signal is leading or lagging in phase by 90 degrees compared to said source signal;
(g) adding or reducing capacitance to vary the count per cycle of said compared signal as needed to establish a 90 degree phase between said carrier signal and said source signal;
(h) transmitting a signal from a computer or microprocessor to one or more of said RFID transponders; and
(i) transmitting a signal from said one or more RFID transponders to said antenna and said computer.

10. The method according to claim 9 wherein at least some of said RFID transponders are passive and further including the step of powering up said passive RFID transponders by delivering power thereto from said antenna.

11. The method according to claim 9 wherein at least some of said RFID transponders are active with the capability of being turned on and off and further including the step of delivering a signal from said antenna to turn on RFID transponders which are off.

12. The method according to claim 6 wherein at least some of said RFID transponders are passive and further including the step of powering up said passive RFID transponders by delivering power thereto from said antenna.

13. The method according to claim 6 wherein at least some of said RFID transponders are active with the capability of being turned on and off and further including the step of delivering a signal from said antenna to turn on RFID transponders which are off.

14. The automatic tuning system of claim 1 wherein at least some of said RFID transponders are passive and said antenna delivers power to said passive RFID transponders.

15. The automatic tuning system of claim 1 wherein at least some of said RFID transponders are capable of being turned from off to on and a signal from said antenna turns on RFID transponders which are off.

\* \* \* \* \*